United States Patent
Nakagawa et al.

[11] Patent Number: 6,163,051
[45] Date of Patent: Dec. 19, 2000

[54] HIGH BREAKDOWN VOLTAGE SEMICONDUCTOR DEVICE

[75] Inventors: Akio Nakagawa, Yokohama; Tomoko Matsudai; Hideyuki Funaki, both of Tokyo; Norio Yasuhara, Kawasaki, all of Japan

[73] Assignee: Kabushiki Kaisha Toshiba, Kawasaki, Japan

[21] Appl. No.: 09/154,041

[22] Filed: Sep. 16, 1998

Related U.S. Application Data

[63] Continuation-in-part of application No. 09/072,460, May 5, 1998.

[30] Foreign Application Priority Data

Aug. 24, 1995 [JP] Japan ................................. 7-216350
Sep. 17, 1997 [JP] Japan ................................. 9-252352
Mar. 16, 1998 [JP] Japan ................................. 10-065759

[51] Int. Cl.[7] ................... H01L 29/76; H01L 29/94; H01L 31/062; H01L 31/113; H01L 31/119
[52] U.S. Cl. ............... 257/331; 257/330; 257/332; 257/343; 257/347; 257/378
[58] Field of Search ................................ 257/133, 330, 257/331, 332, 343, 378, 347

[56] References Cited

U.S. PATENT DOCUMENTS

| | | | |
|---|---|---|---|
| 5,321,289 | 6/1994 | Baba et al. | 257/331 |
| 5,723,891 | 3/1998 | Malhi | 257/341 |
| 5,910,669 | 6/1999 | Chang et al. | 257/339 |
| 5,915,180 | 6/1999 | Hara et al. | 438/270 |
| 5,929,481 | 7/1999 | Hshieh et al. | 257/328 |
| 5,986,304 | 11/1999 | Hshieh et al. | 257/330 |

FOREIGN PATENT DOCUMENTS 7-273319  10/1995  Japan.

*Primary Examiner*—Ngân V. Ngô
*Attorney, Agent, or Firm*—Oblon, Spivak, McClelland, Maier & Neustadt, P.C.

[57] ABSTRACT

A high breakdown voltage semiconductor device comprising a first base region of a first conductivity type, a second base region of a second conductivity type, which is formed in a surface region of the first base region, a first gate insulation film formed on an inner wall of a first LOCOS groove formed passing through the second base region to reach the first base region, a first gate electrode formed on the first gate insulation film, a first source region of a first conductivity type, which is formed in a surface region of the second base region around the first LOCOS groove in such a manner as to contact with the first gate insulating film, a first drain region formed in a surface region of the first base region in such a manner as to be spaced apart from the second base region, a source electrode formed on the first source region and on the second base region, and a drain electrode formed on the first drain region.

10 Claims, 17 Drawing Sheets

TRENCH GATE (a) — OXIDATION (b) — PEP / Et'g OF OXIDE FILM / CDE (c)

(d) — Et'g OF OXIDE FILM / OXIDATION / Et'g OF OXIDE FILM (e) — GATE OXIDATION / DEPOSITION OF SiN / RE-OXIDATION (f) — DEPOSITION OF 1st POLY-Si / OXIDATION OF POLY-Si / DEPOSITION OF 2nd POLY-Si

HIGH BREAKDOWN VOLTAGE SEMICONDUCTOR DEVICE

CROSS-REFERENCE TO RELATED APPLICATIONS

This is a Continuation-in-Part application of U.S. patent application Ser. No. 09/072,460, filed in May 5, 1998, the entire contents of which are incorporated herein by reference.

BACKGROUND OF THE INVENTION

This invention relates to a high breakdown voltage semiconductor device having an insulated gate structure.

IGBT (Insulated Gate Bipolar Transistor) is a novel high breakdown voltage semiconductor device which is provided with a high speed switching property peculiar to a power MOSFET and with a high output property peculiar to a bipolar transistor, and hence is utilized extensively in recent years in the field of power electronics, e.g. as an inverter or a switching power source.

However, a lateral IGBT of this kind is accompanied with the following problems. Namely, at the occasion of turn-on of the IGBT, a positive voltage is applied to the gate electrode thereof thereby turning the channel region of the surface of p-type base region into a conductive state. In this case however, a voltage drop is caused to generate at this channel region to such an extent as to invite a problem that the ON-state voltage of the device becomes higher.

BRIEF SUMMARY OF THE INVENTION

An object of the present invention is to provide a high breakdown voltage semiconductor device having an insulated gate structure, which is excellent in ON-state characteristics.

Namely, according to the present invention, there is provided a high breakdown voltage semiconductor device comprising:

a first base region of a first conductivity type;

a second base region of a second conductivity type, which is formed in a surface region of the first base region;

a first gate insulation film formed on an inner wall of a first LOCOS groove formed passing through the second base region to reach the first base region;

a first gate electrode formed on the first gate insulation film;

a first source region of a first conductivity type, which is formed in a surface region of the second base region around the first LOCOS groove in such a manner as to contact with the first gate insulating film;

a first drain region formed in a surface region of the first base region in such a manner as to be spaced apart from the second base region;

a source electrode formed on the first source region and on the second base region; and a drain electrode formed on the first drain region.

According to the present invention, there is further provided a high breakdown voltage semiconductor device comprising:

a first base region of a first conductivity type;

a drain region formed in a surface region of the first base region;

a second base region of a second conductivity type, which is formed in a surface region of the first base region;

a gate insulation film formed on an inner wall of a LOCOS groove formed passing through the second base region to reach the first base region;

a gate electrode formed on the gate insulation film;

a source region of a first conductivity type, which is formed in a surface region of the second conductive type base region around the first LOCOS groove in such a manner as to contact with the gate insulating film;

a drain electrode formed on the drain region; and a source electrode formed on this first conductive type source region and on the second conductive type base region in such a manner that a distance from the center of the source electrode to an edge of the gate electrode is not more than 0.9 µm;

wherein a width of bottom surface of the LOCOS groove is 2 µm or more and a depth of the LOCOS groove is 0.7 µm or more.

According to the present invention, there is still further provided a semiconductor device having a lateral IGBT, the IGBT comprising:

a drift region of a first conductivity type formed by using a semiconductor active layer of a high resistivity;

a drain region of a second conductivity type formed in a common surface of the drift region;

a base region of the second conductivity type formed in the common surface of the drift region;

a source region of the first conductivity type formed in a surface of the base region;

a drain electrode arranged in contact with the drain region;

a source electrode arranged in contact with the source and base regions; and a main gate electrode facing, through a gate insulating film, a surface of the base region which is interposed between the source region and the drift region, and is located on a side facing the drain region, wherein a relay region of the first conductivity type having a resistivity lower than that of the drift region is formed in the common surface of the drift region to have a facing portion which faces the source region through the base region under the main gate electrode, a shallow diffusion region of the second conductivity having a concentration low enough to be depleted in a thermal equilibrium condition is formed in the surface of the relay region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The high breakdown voltage semiconductor device according to this invention is featured in that a gate employing LOCOS (Local Oxidation of Silicon) groove is adopted in place of the conventional trench gate. By the way, by the term "LOCOS groove", it is intended to means a groove which can be formed by a process comprising the steps of selectively oxidizing a silicon layer by means of LOCOS method thereby to form an oxide film, and wet-etching the oxide film by means of $NH_4F$.

In the case of trench gate, since the trench is formed using RIE (Reactive Ion Etching), the inner wall of the trench groove is more likely to be damaged. As a result, the mobility of carrier would be lowered, the ON-state resistance would be increased and the latch-up resistance (latch-up tolerance) would be lowered.

By contrast, in the case of LOCOS groove, since the groove is formed by removing an oxide film which has been formed by means of LOCOS method, there is no possibility of generating a damage as in the case of RIE. Therefore, the lowering of mobility of carrier can be prevented according to this invention, thus making it possible to realize a lateral IGBT which is lower in the ON-state resistance and higher in latch-up resistance than the structure bearing the conventional trench gate.

Further, it has been found by the study made by the present inventor that when the width of the bottom surface of an LOCOS groove is set to 2 µm or more and, at the same time, the depth of the LOCOS groove is set to 0.7 µm or more in a fine vertical IGBT employing an LOCOS gate, the forward voltage $V_F$ can be effectively lowered. Therefore, according to a vertical IGBT where the width of the bottom surface and the depth of an LOCOS groove are limited to as mentioned above, not only the effects mentioned above but also the effect of effectively lowering the forward voltage $V_F$ can be obtained. In this case, the term of "fine" means that the distance between the center of the source electrode and the edge of gate electrode is not more than 0.9 µm.

This invention will be now explained with reference to drawings illustrating various examples of this invention. By the way, in the following examples, the first conductive type is assumed as n-type, and the second conductive type is assumed as p-type.

(A first example)

Figure 1:
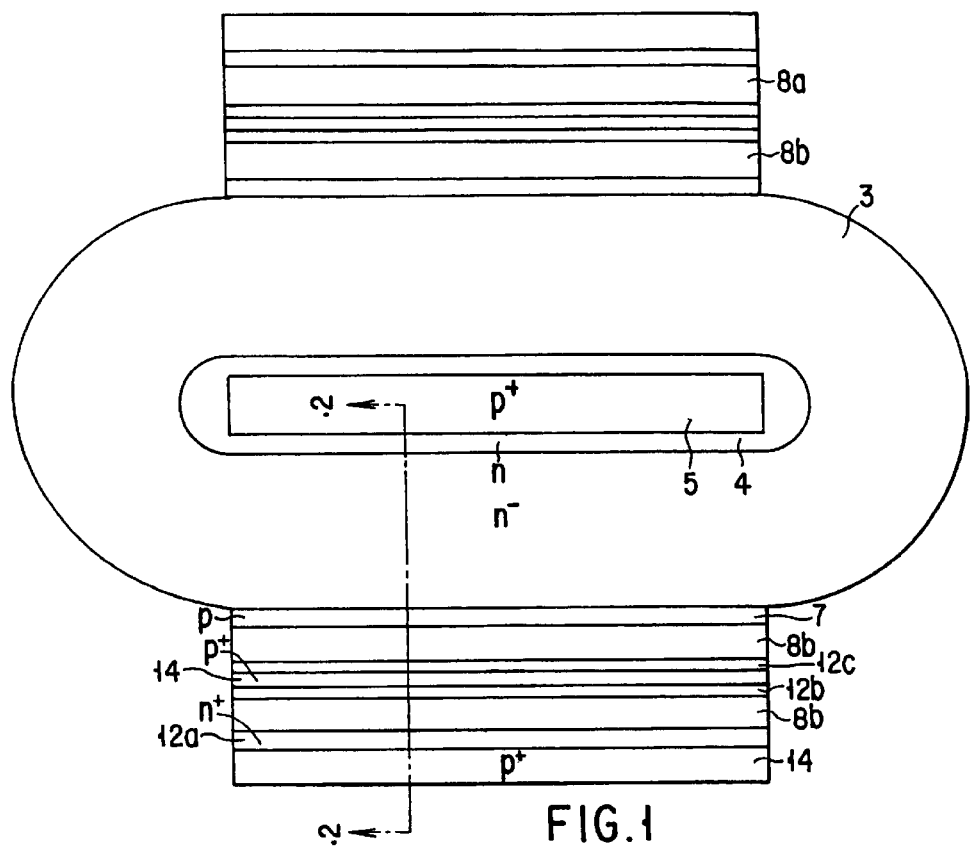
FIG. 1 is a plan view illustrating a lateral IGBT according to a first example of this invention.
Figure 2:
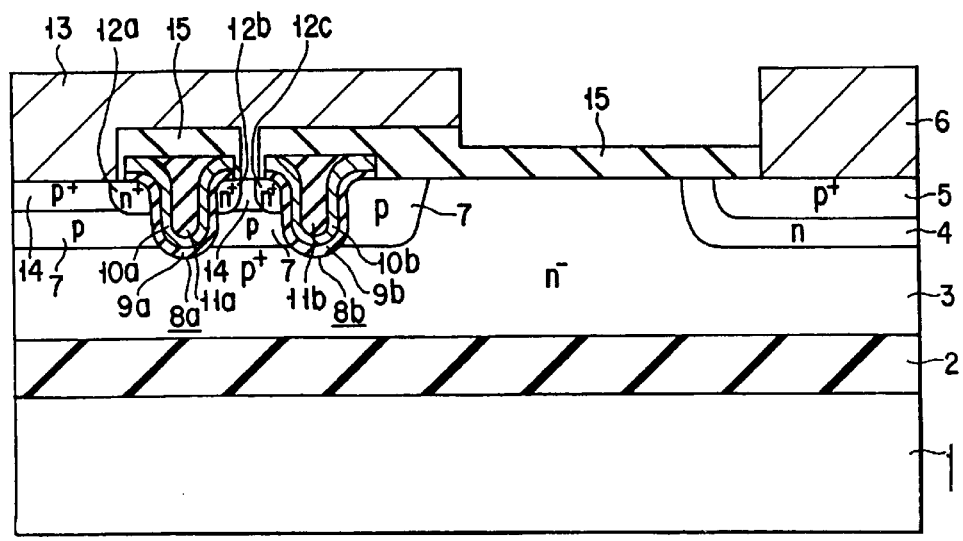
FIG. 2 is a cross-sectional view taken along the line II—II of FIG. 1.

FIG. 1 shows a plan view illustrating a lateral IGBT according to a first example of this invention, and FIG. 2 shows a cross-sectional view taken along the line II—II of FIG. 1.

Reference to FIGS. 1 and 2, reference numeral 1 represents a silicon substrate, on which a high resistance n-type base region (SOI layer) 3 is formed with a silicon oxide film 2 being interposed there-between. An SOI substrate is constituted by these silicon substrate 1, silicon oxide film 2 and n-type base region 3. This SOI substrate can be prepared by means of a direct bonding method for instance.

In this SOI substrate, the thickness of the silicon oxide film 2 should preferably be in the range of 1 to 5 µm, the impurity concentration of the n-type base region 3 should preferably be in the range of $1.0 \times 10^{10}$ $cm^{-2}$ to $3.0—10^{12}$ $cm^{-2}$, more preferably $0.5 \times 10^{12}$ $cm^{-2}$ to $2.0 \times 10^{12}$ $cm^{-2}$, and the thickness of the n-type base region 3 should preferably be 20 µm or less, more preferably 10 µm or less.

An n-type buffer layer 4 is selectively formed in the surface region of the n-type base region 3, and a p-type drain region 5 of high impurity concentration is selectively formed in the surface region of this n-type buffer layer 4. This p-type drain region 5 is provided with a drain electrode 6.

In addition to the n-type buffer layer 4 and p-type drain region 5, a p-type base region 7 is selectively formed in the surface region of the n-type base region 3. A pair of grooves (hereinafter referred to as LOCOS groove) 8a and 8b are formed by means of an LOCOS method in such a manner that they extend from the surface of the p-type base region 7 down to the underlying n-type base region 3, thus passing through the p-type base region 7. The longitudinal direction of these LOCOS grooves 8a and 8b is set approximately parallel with the longitudinal direction of the p-type drain region 5. The distance between these LOCOS grooves 8a and 8b should preferably be as short as possible.

Inside these LOCOS grooves 8a and 8b, there are formed gate electrodes 10a and 10b respectively with gate oxide films 9a and 9b being respectively interposed therebetween. Insulation films 11a and 11b made of an oxide film for instance are deposited on these gate electrodes 10a and 10b to such an extent as to bury the LOCOS grooves 8a and 8b.

In the surface portion of the p-type base region 7 disposed around the LOCOS grooves 8a and 8b, there are selectively formed N-type source regions 12a, 12b and 12c of high impurity concentration in such a manner that these source regions 12a, 12b and 12c contact with the gate oxide films 9a and 9b.

However, this n-type source regional is not formed at all on the surface region of the p-type base region 7 which is located between the LOCOS groove 8b positioned most close to the p-type drain region 5 and the p-type drain region 5.

Namely, the LOCOS groove 8a positioned on the left side in FIG. 2 is accompanied with a pair of insulating gate structures, i.e. the n-type source region 12a and 12b, while the LOCOS groove 8b positioned on the right side in FIG. 2 is accompanied with a single insulating gate structure, i.e. the n-type source region 12c.

A source electrode 13 is formed in each of the n-type source regions 12a, 12b and 12c, and in the p-type base region 7. Specifically, the source electrode 13 is directly contacted with each of the n-type source region 12a, 12b and 12c but is indirectly contacted with the p-type base region 7 via a p-type contact layer 14 of high impurity concentration which is formed in the surface region of the p-type base region 7. By the way, a reference numeral 15 in FIG. 2 denotes an interlayer insulating film.

In the lateral IGBT according to this example, a LOCOS gate is employed in place of a trench gate. Since the trench gate is generally formed by means of RIE, the inner wall of the trench groove is more likely to be damaged. As a result, the mobility of carrier would be lowered, the ON-state resistance would be increased and the latch-up resistance would be lowered.

By contrast, in the case of LOCOS gate, since the LOCOS grooves 8a and 8b are formed by making use of LOCOS oxidation and wet etching, there is no possibility of generating a damage as in the case of RIE. Therefore, according to this example, the lowering of mobility of carrier can be prevented, thus making it possible to realize a lateral IGBT which is lower in the ON-state resistance and higher in latch-up resistance than the conventional device employing a trench gate. Specific method of forming an LOCOS gate will be explained hereinafter.

Moreover, since the LOCOS grooves 8a and 8b are formed also in the n-type base region 3, the flow of carrier in the n-type base region 3 can be interrupted by these LOCOS grooves 8a and 8b. As a result, the electrons injected into the p-type base region 7 from the n-type source region 12, as well as the positive holes moved into the source region from the drain region can be effectively accumulated in the n-type base region 3 formed below the LOCOS grooves 8a and 8b.

As a result, the resistance of the n-type base region 3 can be minimized, and hence a sufficient quantity of carrier can be supplied to three n-type source regions 12 as well as to the vicinity of these source regions 12 thereby simultaneously forming three n-type channels at the occasion of turn-on and conductive condition.

Accordingly, three n-type channels are simultaneously formed and functioned in a single device at the occasion of turn-on, thus enhancing the channel density. Even with such an effect, the ON-state voltage can be lowered.

Further, according to this example, the processes common to both for forming the IGBT in the IGBT region and for forming elements in peripheral region (circuit) can be increased, thus making it possible to minimize the number of manufacturing steps.

FIGS. 3A to 3J, 4A and 4B illustrate specifically such a manufacturing process. In these FIGURES, the left side thereof shows the IGBT region and the right side thereof shows the peripheral region.

Figure 3A:
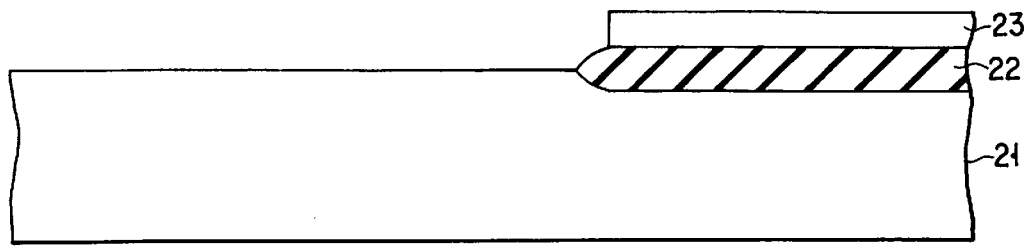
FIGS. 3A to 3J are cross-sectional views illustrating in stepwise a manufacturing process of an IGBT employing an LOCOS groove and of an MOS transistor employing an LOCOS element isolation.
Figure 3B:
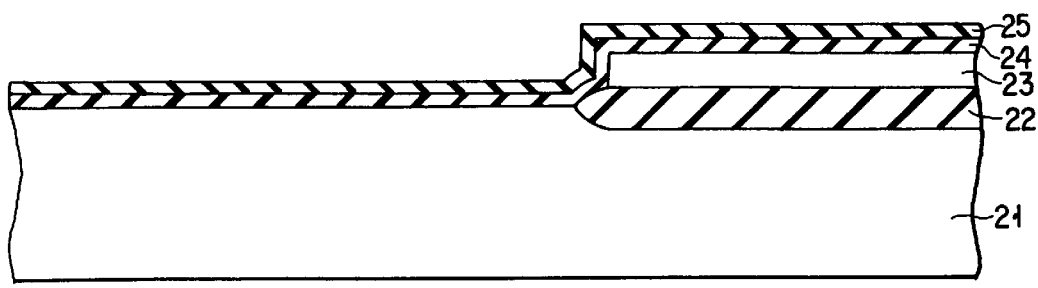

First of all, as shown in FIG. 3A, an oxide film 22 and polycrystalline or amorphous silicon film 23 are successively formed on a silicon layer (SOI layer) 21 in the peripheral region. Then, as shown in FIG. 3B, a laminate film consisting of an oxide film 24 and a silicon nitride film 25 for forming a mask pattern is formed in the IGBT region as well as in the peripheral region.

Figure 3C:
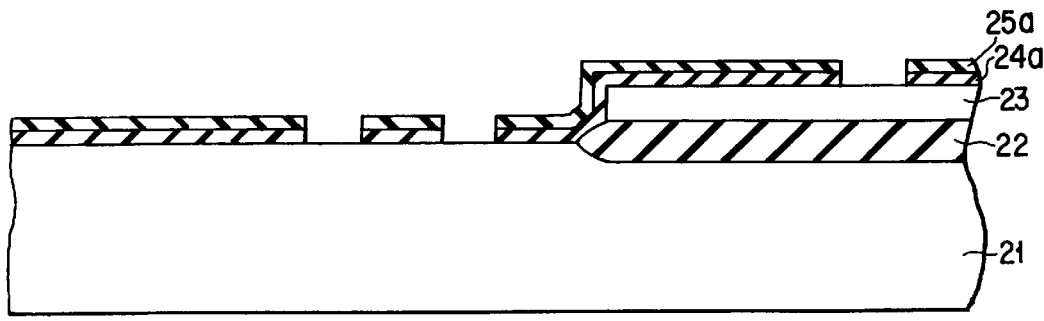
Figure 3D:
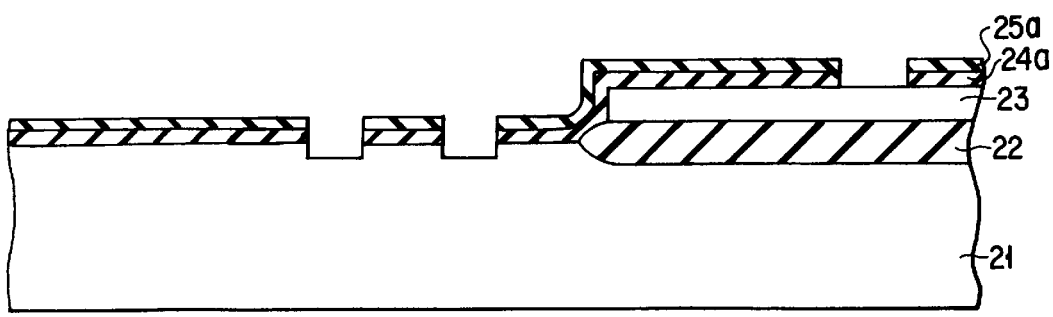

Then, as shown in FIG. 3C, these oxide film 24 and silicon nitride film 25 are worked by making use of photolithography and etching method thereby to form mask patterns 24a and 25a. Subsequently, as shown in FIG. 3D, the surface of the silicon layer (n-type base region) in the IGBT region is slightly etched by means of RIE method with these mask patterns 24a and 25a being employed as an etching resistant mask.

Figure 3E:
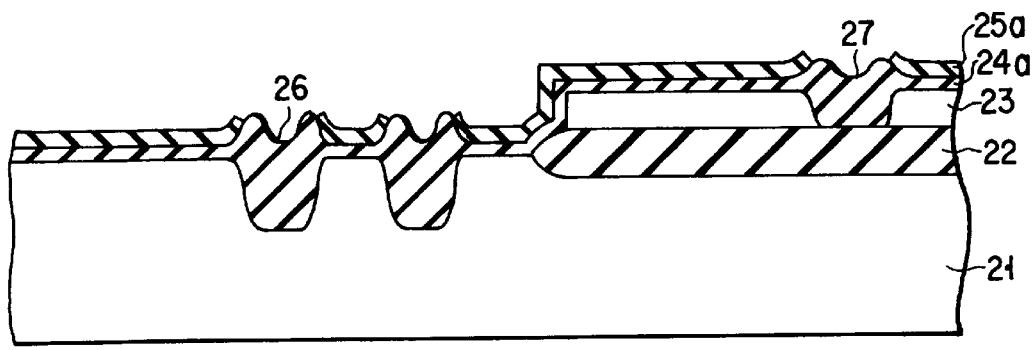

Thereafter, as shown in FIG. 3E, the exposed portions of the silicon film 21 in the IGBT region and the exposed portions of the silicon film 23 in the peripheral region are oxidized (LOCOS oxidation) using these mask patterns 24a and 25a as an oxidation resistant mask, thus forming an oxide film 26 in the IGBT region and an oxide film 27 in the peripheral region, the oxide film 27 functioning as an element-isolating insulation film.

Subsequently, the oxide film that has been formed on the surfaces of the mask patterns 24a and 25a at the occasion of forming the oxide films 26 and 27 is removed, and then the mask pattern (silicon nitride film) 25a and the mask pattern (silicon oxide film) 24a are successively removed.

Figure 3F:
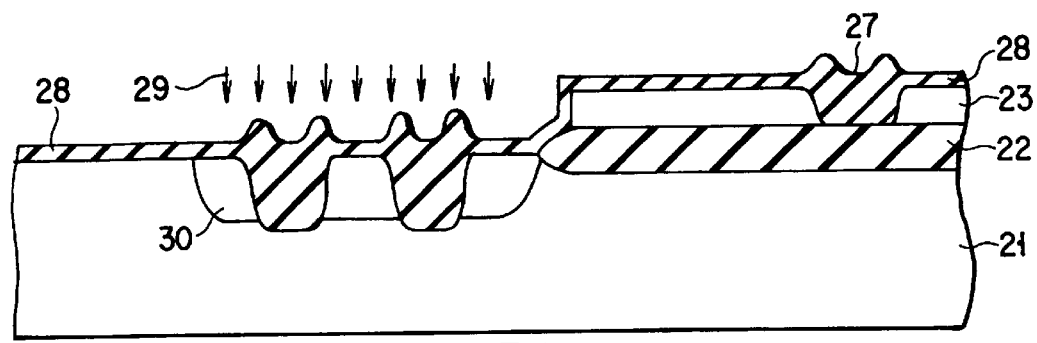

Thereafter, as shown in FIG. 3F, the oxide film 28 is formed in the silicon region that has been exposed as a result of the removal of the mask patterns 24a and 25a. Then, a p-type impurity ion 29 such as boron is injected into the IGBT region, which is then annealed thereby selectively forming a p-type base region 30 in the surface region of the silicon layer (n-type base region) 21 in the IGBT region. It may be advisable in this case to form in advance a resist (not shown) for instance in the peripheral region so as to prevent the p-type impurity ion 29 from being injected into the peripheral region, the resist being removed after finishing this ion implantation.

Figure 3G:
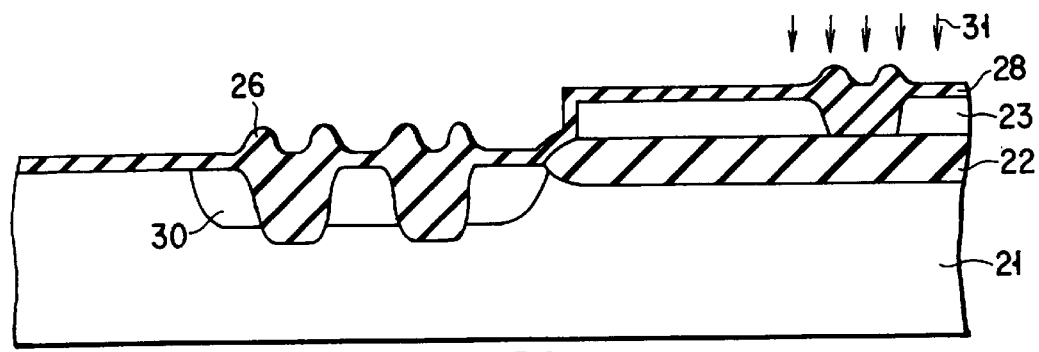

Then, as shown in FIG. 3G, a p-type impurity ion 31 is injected into the peripheral region, which is then annealed so as to adjust the threshold voltage. At this occasion, a resist (not shown) for instance is formed in advance in the IGBT region so as to prevent the p-type impurity ion 31 from being injected into the IGBT region, the resist being removed after finishing this ion implantation.

By the way, if a p-channel MOSFET is to be formed, an n-type impurity ion such as phosphorus is injected into a predetermined region, which is then annealed. On the other hand, if p-channel and n-channel MOSFETs are to be formed, the injection of a p-type impurity ion is performed while covering the p-channel MOSFET region with a resist, and then the region thus injected with the ion is annealed, after which the injection of an n-type impurity ion is performed while covering the n-channel MOSFET region with a resist, and then the region thus injected with the ion is annealed.

Figure 3H:
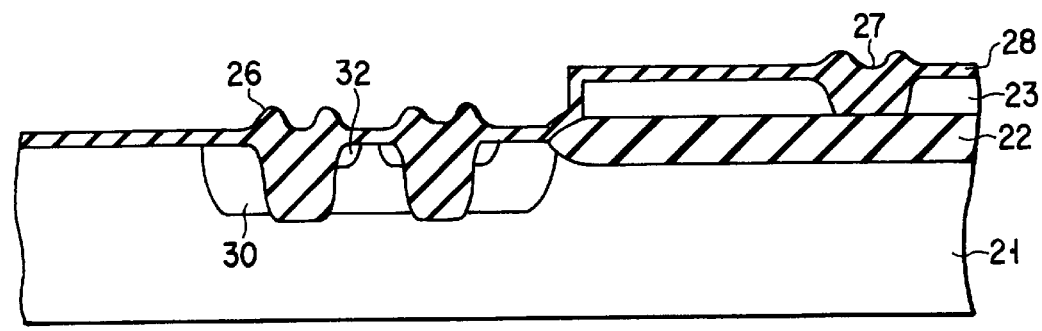

Subsequently, as shown in FIG. 3H, after the peripheral region as well as the region other than the edge portion of the oxide film 26 are covered with a resist (not shown), an n-type impurity ion is injected, the region thus injected with the impurity ion being subsequently annealed, thus forming an n-type source region 32 of high impurity concentration in the surface region of the p-type base region 30. Thereafter, the resist is removed.

By the way, as mentioned later, it. is also possible to adopt a method wherein an n-type source region of high impurity concentration is formed after an n-type source region 32 of low impurity concentration (LDD) is formed.

Figure 3I:
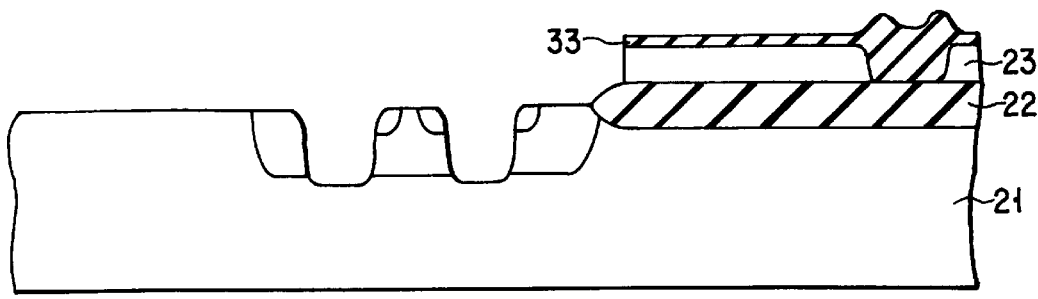
Figure 3J:
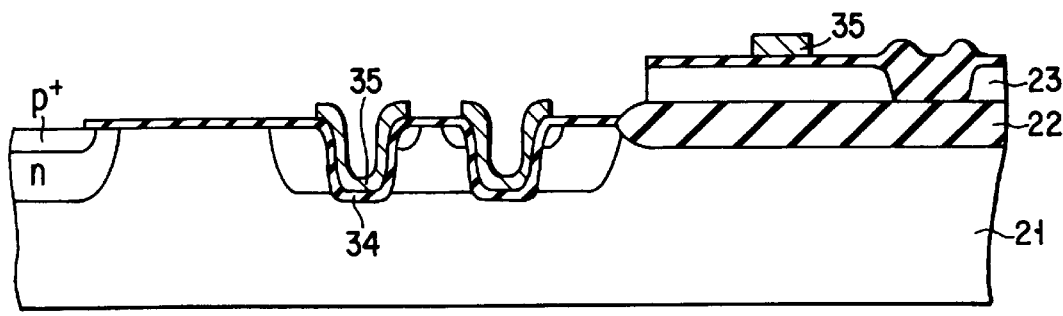

Then, as shown in FIG. 3I, after the oxide films 26 and 28 are removed, a gate oxide film 33 is formed in the peripheral region. After a gate oxide film 34 is formed in the IGBT region as shown in FIG. 3J, a gate electrode 35 consisting of a polycrystalline silicon film is formed in the IGBT region as well as in the peripheral region.

In this manner, an insulation gate structure where a gate electrode is formed inside an LOCOS groove with a gate oxide film 34 being interposed therebetween can be accomplished. By the way, the gate oxide film 34 may be formed concurrently in the step of forming the gate oxide film 33. The process following the step of forming the gate electrode 35 may be the same as that of the conventional manufacturing process of IGBT and MOS transistor.

Next, the process of forming an n-type source region 32 of low impurity concentration instead of forming an n-type source region 32 of high impurity concentration in the aforementioned step of FIG. 3H will be explained. By the way, since the steps up to FIG. 3J are the same as explained above, the steps following FIG. 3J will be explained.

Figure 4A:
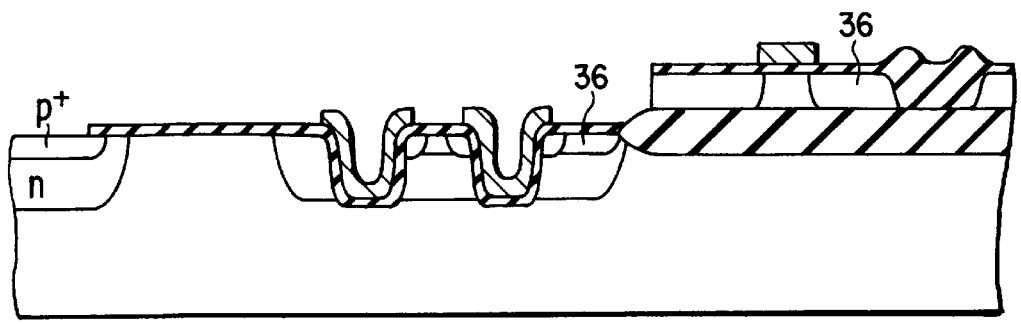
FIGS. 4A and 4B are cross-sectional views illustrating in stepwise a manufacturing process of an IGBT employing an LOCOS groove and of an MOS transistor employing an LOCOS element isolation.

Namely, as shown in FIG. 4A, by making use of the gate electrode 35 as a mask, an n-type impurity ion is injected under the conditions of a low accelerating voltage and low dosage, the region thus injected with the impurity ion being subsequently annealed, thus forming an n-type diffusion region 36 of low impurity concentration. This n-type diffusion region 36 becomes a residual n-type source region 32 of low impurity concentration for the IGBT and also becomes an LDD for the MOSFET.

Figure 4B:
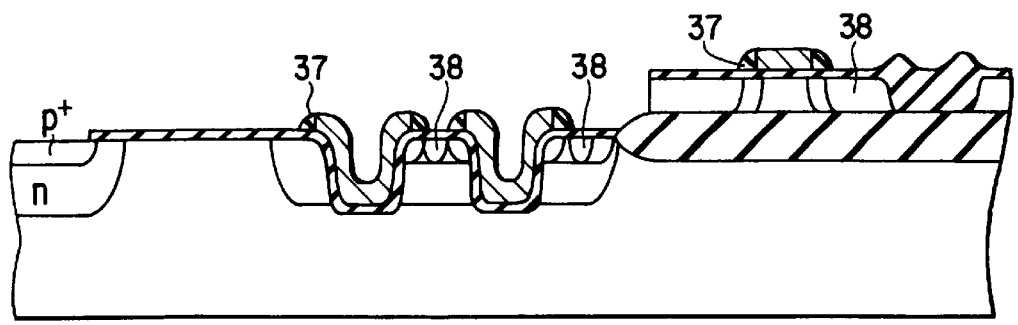

Then, as shown in FIG. 4B, after a gate side wall insulating film 37 is formed, an ion implantation of n-type impurity is performed by making use of these gate side wall insulating film 37 and gate electrode 35 as a mask, thereby forming an n-type diffusion region 38 of high impurity concentration. This n-type diffusion region 38 becomes an n-type source region for the IGBT and also becomes a source/drain diffusion layer for the MOSFET. In this case, a p-type diffusion region 14 of a high impurity concentration is formed in the direction perpendicular to line II—II in FIG. 1. The process following this step may be the same as that of the conventional manufacturing process of IGBT and MOS transistor.

Figure 5:
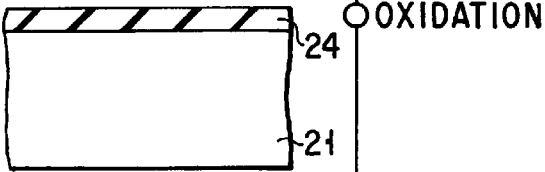
FIG. 5 is a cross-sectional view illustrating the process flowchart of a trench gate.
Figure 5:
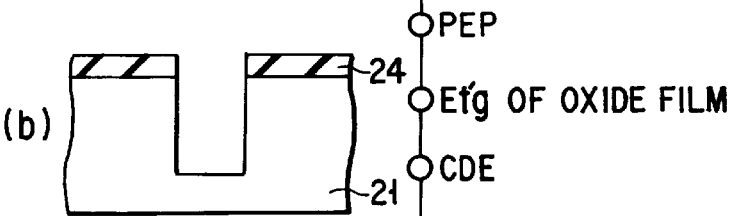
Figure 5:
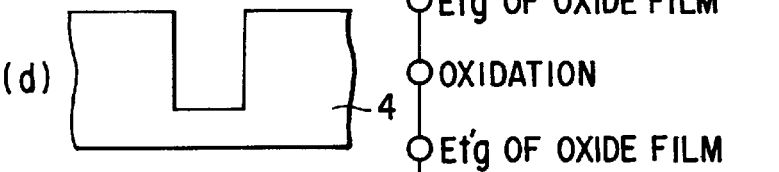
Figure 5:
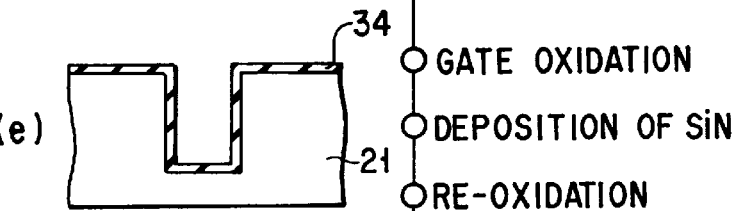
Figure 5:
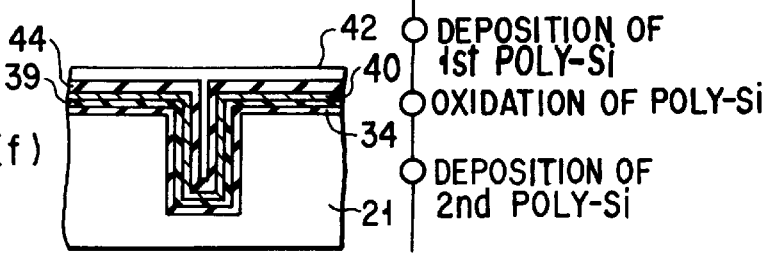
Figure 6:
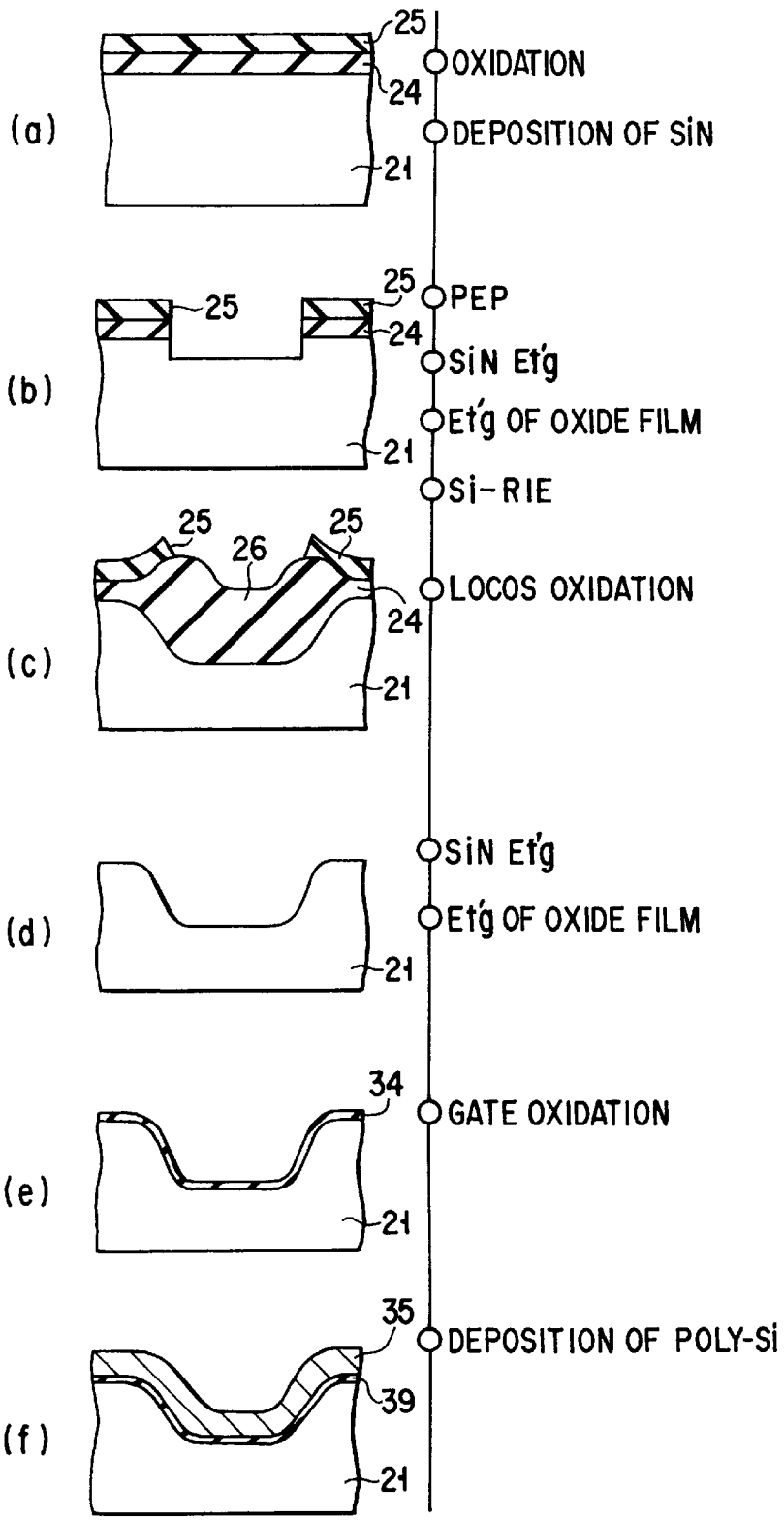
FIG. 6 is a cross-sectional view illustrating the process flow of LOCOS gate.

FIG. 5 shows a process flowchart of a trench gate, while FIG. 6 illustrates the process flow of an LOCOS gate. In these FIGS. 5 and 6, the process up to the step of depositing a polycrystalline silicon film as a gate electrode is shown. In this case, the steps of (a) to (f) are common to both of process flow of a trench gate and process flow of an LOCOS gate. However, the step (c) is not existed in the process flow of a trench gate, but existed only in the process flow of an LOCOS gate.

The method of forming the LOCOS gate is the same as that explained in FIGS. 3A to 3J or in FIGS. 4A and 4B. In FIGS. 5 and 6, the same parts as those shown in FIGS. 3A to 3J or in FIGS. 4A and 4B are indicated by the same reference numerals. In FIGS. 5 and 6, the reference numeral 39 denotes a silicon nitride oxide film which has been formed by oxidizing (re-oxidation) a silicon nitride film; the reference numeral 40, a first polycrystalline silicon film; the reference numeral 41, a silicon oxide ($SiO_2$) film which has been formed by oxidizing the surface of the first polycrystalline silicon film 40; and the reference numeral 42, a second polycrystalline silicon film.

It will be clear from FIGS. 5 and 6 that as many as thirteen steps are required in the case of forming a trench gate, whereas in the case of forming an LOCOS gate, only eleven steps are required. Therefore, by adopting an LOCOS gate, the number of manufacturing step can be minimized.

A first reason for requiring an increased number of manufacturing step in the case of forming a trench gate can be ascribed to the fact that a step of etching a silicon layer 21 by means of CDE method for rounding the upper portion of trench is required in the step (b) shown in FIG. 5 after the trench is formed by etching the silicon layer 21 by means of RIE method with an oxide film 24 being employed as a mask.

Whereas in the case of the LOCOS gate, since an LOCOS oxidation is performed subsequently, the step of etching the silicon layer 21 by means of CDE method is not required at the step (b) shown in FIG. 6 in contrast to the case of forming a trench gate.

A second reason for requiring an increased number of manufacturing step in forming a trench gate is due to the fact that it requires at the step (e) shown in FIG. 5 a step of forming an oxide film by oxidizing the inner surface of the trench and also a step of removing the oxide film by means of wet etching so as to smoothen the inner surface of the trench to the same degree as the inner surface of an LOCOS groove before forming the gate oxide film 34.

(A second example)

Figure 7:
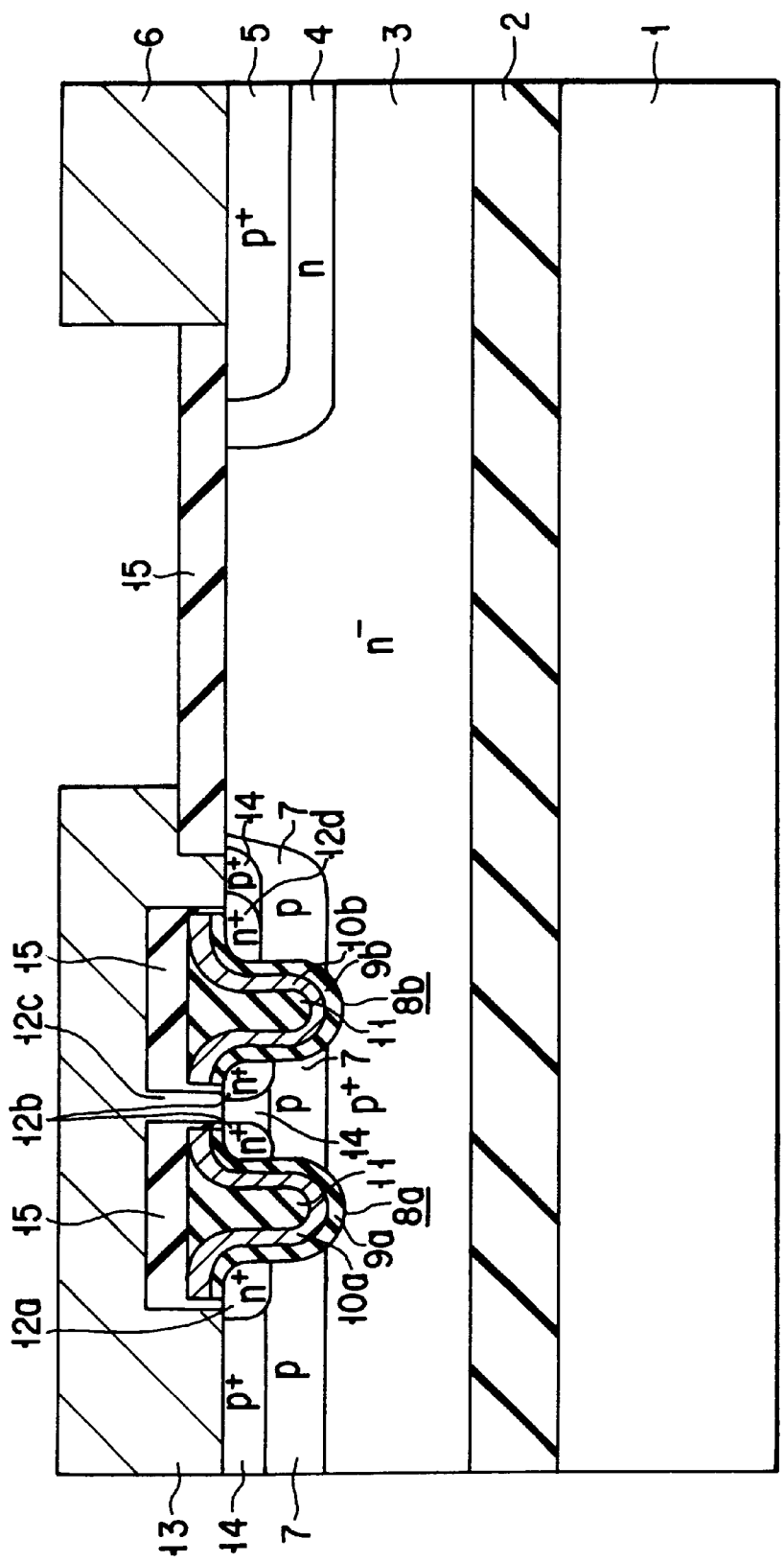
FIG. 7 is a cross-sectional view illustrating a lateral IGBT according to a second example of this invention.

FIG. 7 shows a cross-sectional view illustrating a lateral IGBT according to a second example of this invention. In FIG. 7, the same parts as those of the lateral IGBT shown in FIG. 2 are indicated by the same reference numerals thereby to omit detailed explanations thereof.

The lateral IGBT according to this example differs from that of the first example in the respect that an n-type source region 12d is formed also in the surface region of the p-type base region 7 located around the LOCOS groove 8 which is positioned most close to the p-type drain region 5.

The insulation gate structures formed in the LOCOS grooves 8a and 8b are constructed such that the capability thereof to form an n-type channel becomes more deteriorated as the distance thereof from the p-type drain region 5 becomes larger. Therefore, it is important, for the purpose of lowering the ON-state resistance, to form an n-type source region 12d in the LOCOS groove 8b which is positioned most close to the p-type drain region 5 as set forth in this example, thereby to increase the area of the n-type channel region.

Further, since a source electrode 13 is contacted with the p-type base region 7 which i3 positioned most close to the p-type drain region 5, the latch-up resistance can be enhanced, thus making it possible to improve the turn-off speed.

(A third example)

Figure 8:
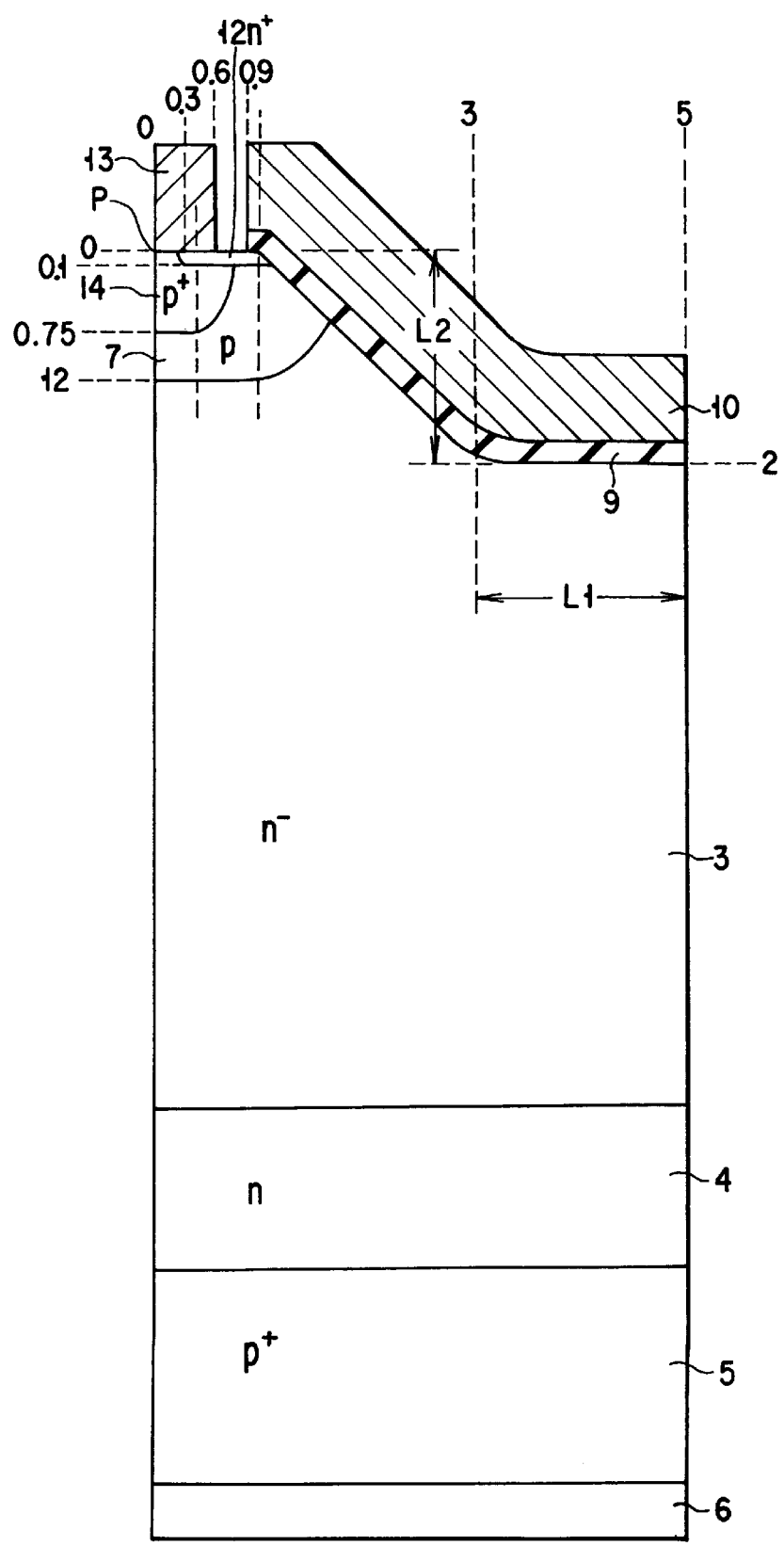
FIG. 8 is a cross-sectional view illustrating a half cell portion of a vertical IGBT according to a third example of this invention.

FIG. 8 shows a cross-sectional view illustrating a half cell portion of a vertical IGBT according to a third example of this invention. In FIG. 8, the same parts as those of the lateral IGBT shown in FIG. 2 are indicated by the same reference numerals thereby to omit detailed explanations thereof.

In FIG. 8, the dimensions [$\mu m$] as measured from the standard point p are also indicated. Further, a representative impurity concentration [$cm^{-3}$] of each layer is as explained below. Namely, the impurity concentration of the n-type base region 3 is $1.35 \times 10^{14}$, the impurity concentration of the n-type buffer layer 4 is $2.7 \times 10^{17}$, the impurity concentration of the p-type drain region 5 is $7.5 \times 10^{18}$, the impurity concentration on the surface of the p-type base region 7 is $4 \times 10^{17}$, the impurity concentration on the surface of the n-type source region 12 is $1.27 \times 10^{20}$, and the impurity concentration on the surface of the p-type contact layer 14 is $2.8 \times 10^{19}$.

The vertical IGBT according to this third example is featured in that it employs a fine LOCOS gate where the distance from the center of the source electrode 13 to the edge of the gate electrode 10 is set to 0.9 μm, and in that the width of bottom surface (2×L1) of the LOCOS groove is set to 2 μm or more, e.g. 4 μm, and the depth L2 of the LOCOS groove is set to 0.7 μm or more, e.g. 2 μm.

The reason for setting to the aforementioned values is as follows. Namely, according to the study made by the present inventor, it has been found that when the width of the bottom surface of an LOCOS groove is set to 2 μm or more and at the same time, the depth of the LOCOS groove is set to 0.7 μm or more in a fine vertical IGBT employing an LOCOS gate, the forward voltage $V_F$ can be effectively lowered.

In this case, the term of "fine" means that the distance between the center of the source electrode 13 and the edge of gate electrode 10 is not more than 0.9 μm. Further, by the term "forward voltage $V_F$", it is meant a drain impressed voltage as the current density becomes 200 A/cm².

Figure 9:
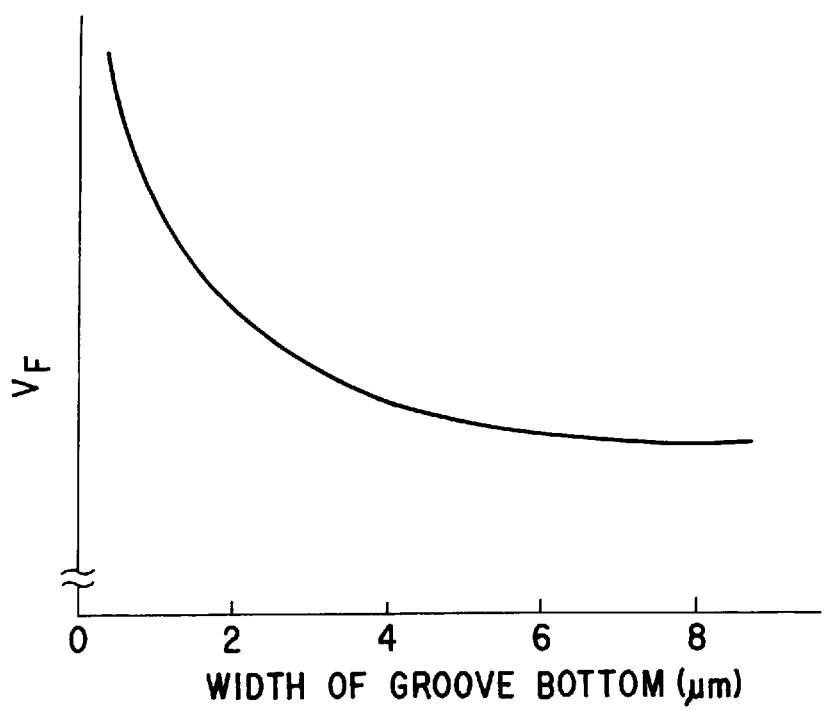
FIG. 9 is a graph illustrating a relationship between the width of the bottom surface of LOCOS groove and a forward voltage $V_F$.

FIG. 9 shows a relationship between the width of the bottom surface of LOCOS groove and the forward voltage $V_F$ when the depth of LOCOS groove is set to 0.7 μm or more. It will be seen from FIG. 9 that when the width of the bottom surface becomes 2 μm or more, the forward voltage $V_F$ is sharply lowered.

Figure 10:
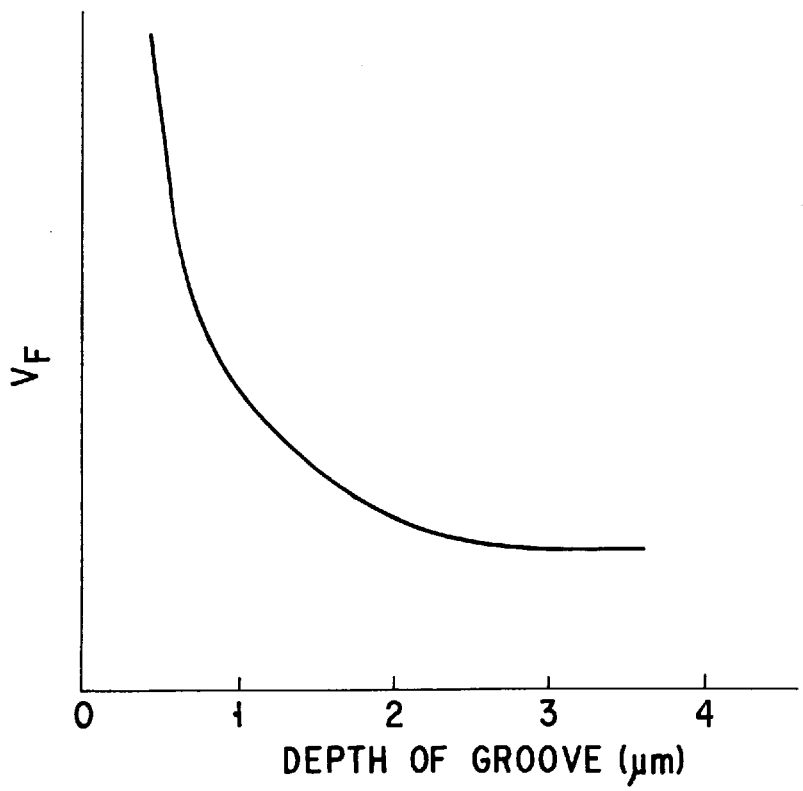
FIG. 10 is a graph illustrating a relationship between the depth of LOCOS groove and a forward voltage $V_F$.

FIG. 10 illustrates a relationship between the depth of LOCOS groove and the forward voltage $V_F$ when the width of the bottom surface of LOCOS groove is set to 2 μm or more. It will be seen from FIG. 10 that when the depth of LOCOS groove becomes 0.7 μm or more, the forward voltage $V_F$ is sharply lowered.

Since an LOCOS gate is employed also in this example, almost the same effects that have been obtained in the first example can be obtained.

(A fourth example)

Figure 11:
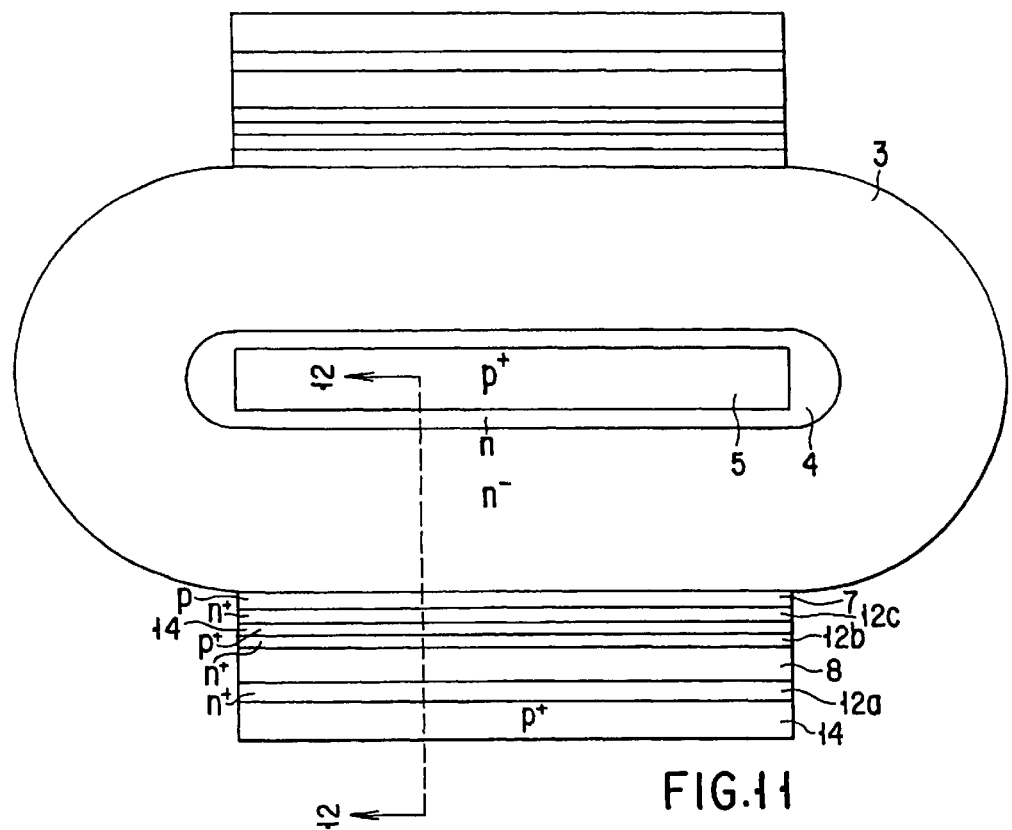
FIG. 11 is a plan view of a lateral IGBT according to a fourth example of this invention.
Figure 12:
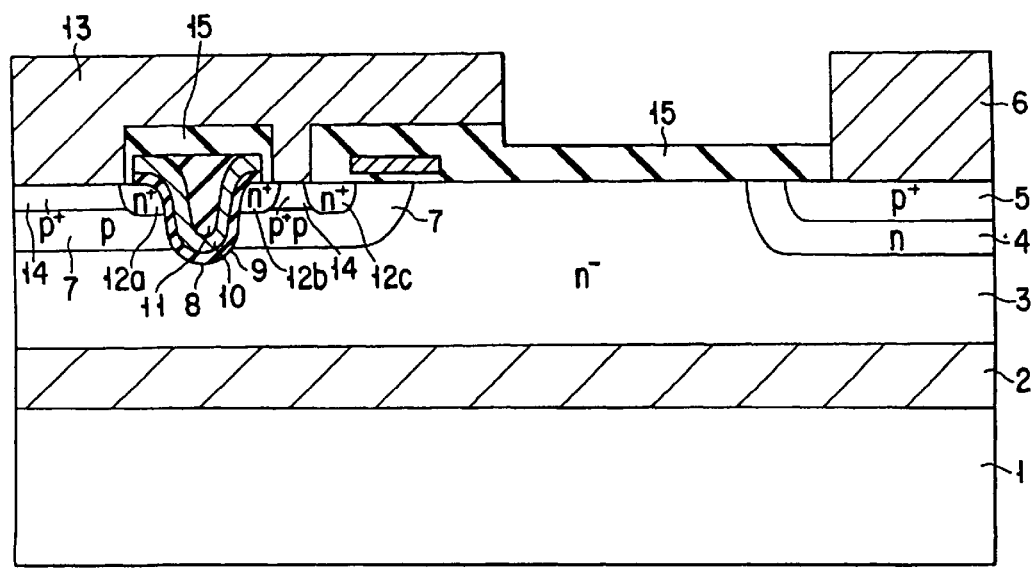
FIG. 12 is a cross-sectional view taken along the line XII—XII of FIG. 11.

FIG. 11 shows a plan view of a lateral IGBT according to a fourth example of this invention, and FIG. 12 shows a cross-sectional view taken along the line XII—XII of FIG. 11.

The lateral IGBT according to this example differs from that of the first example in the respect that the gate which is positioned most close to the p-type drain region 5 is constituted not by a trench gate but by an ordinary planar type gate.

As in the case of the lateral IGBT of the first example, the lateral IGBT according to this example is constructed such that, for the purpose of enhancing the ON-state characteristics, the channel region to be formed around the LOCOS groove 8 which is positioned most close to the p-type drain region 5 is confined to only one side of the LOCOS groove 8 which is located remotest from the p-type drain region 5.

Accordingly, even if the trench gate located most close to the p-type drain region 5 is replaced by an ordinary planar type gate, the area of channel cannot be reduced, thus making it possible to obtain almost the same ON-state characteristics as the lateral IGBT of the first example. Further, employment of a planar type gate is advantageous in that since the length in the lateral direction which is required for the channel region is relatively small, the area of the element can be minimized.

(A fifth example)

Figure 13:
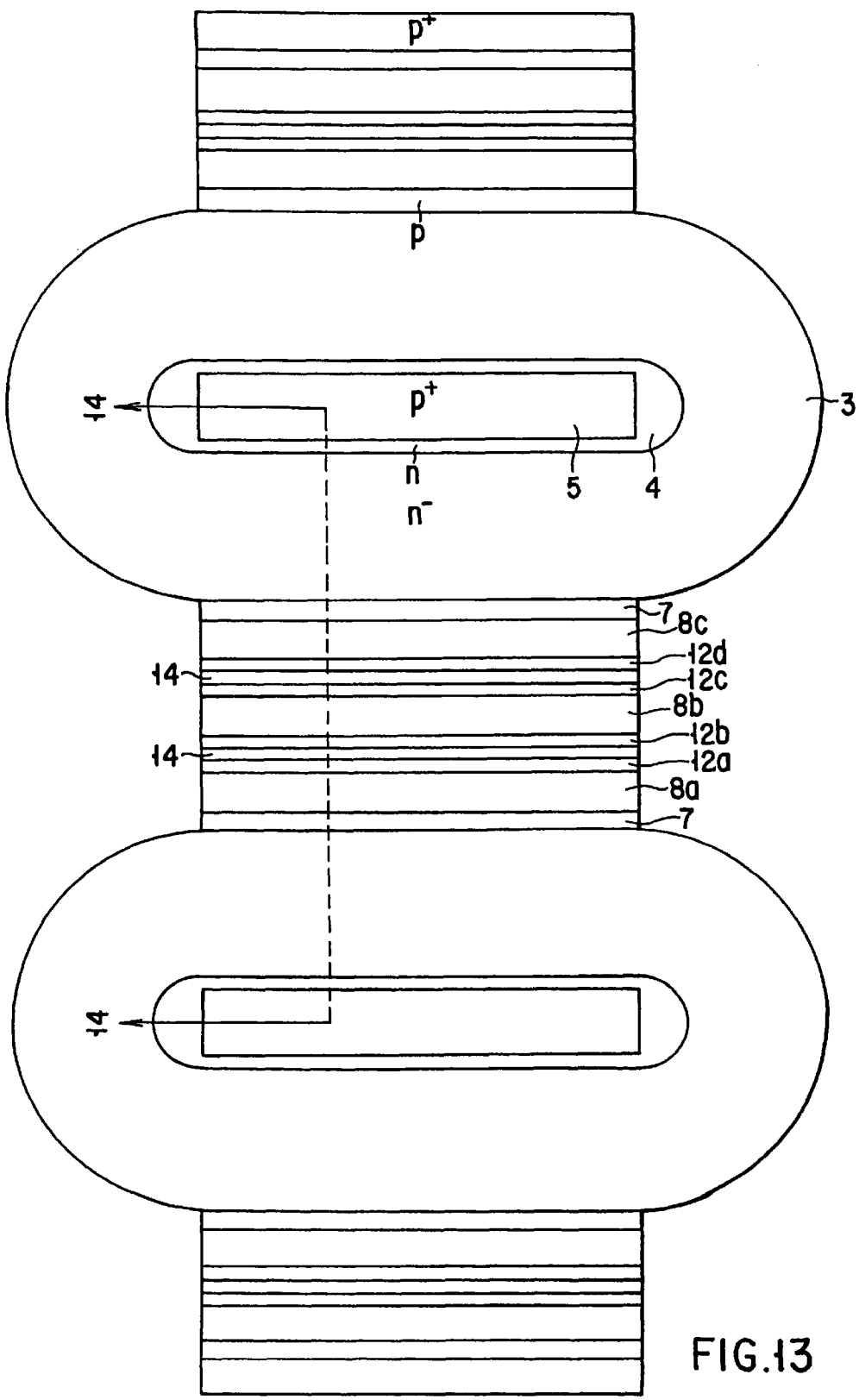
FIG. 13 is a plan view of a lateral IGBT according to a fifth example of this invention.
Figure 14:
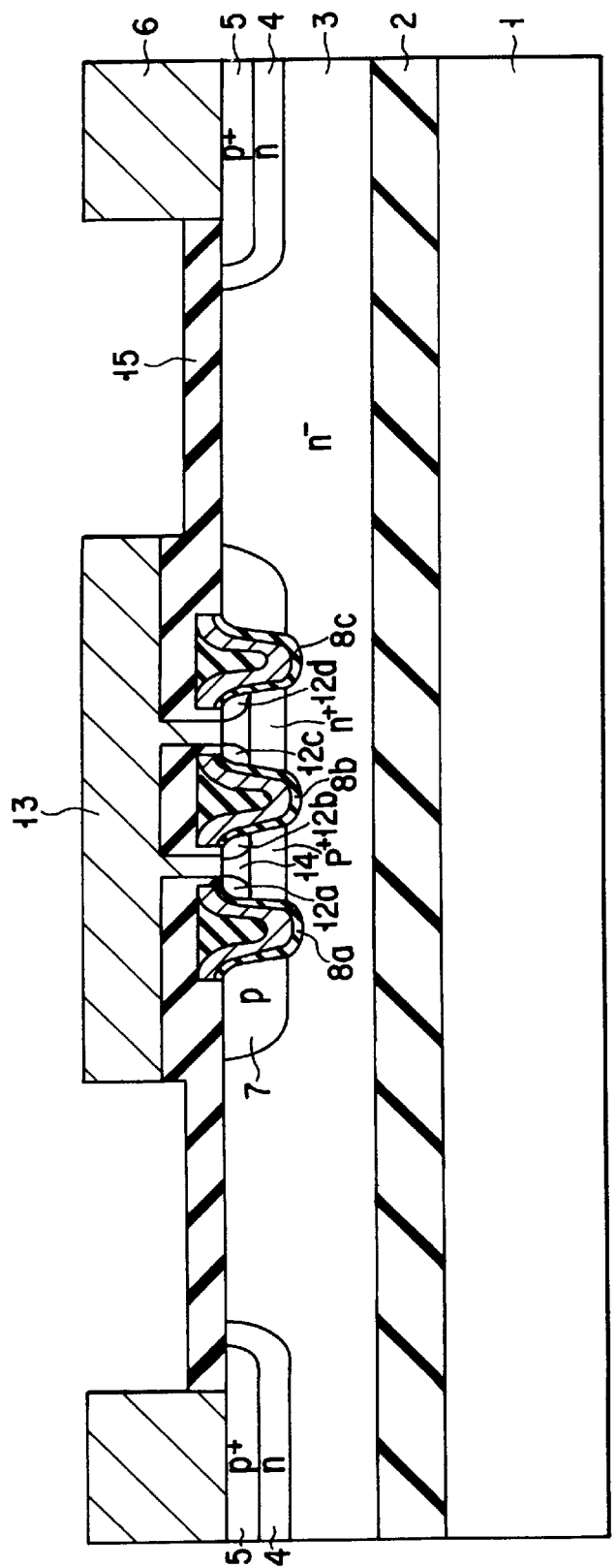
FIG. 14 is a cross-sectional view taken along the line XIV—XIV of FIG. 13.

FIG. 13 shows a plan view of a lateral IGBT according to a fifth example of this invention, and FIG. 14 shows a cross-sectional view taken along the line XIV—XIV of FIG. 13.

The lateral IGBT according to this example differs from that of the first example in the respect that a couple of lateral IGBTs having a common LOCOS gate region on the source region side are disposed parallel with each other. Namely, three LOCOS gates in total are formed, wherein a couple of LOCOS gates formed on the p-type drain region (5) side are respectively designed to act as a gate for each element, and the LOCOS gate (disposed at the center) which is disposed remotest from the p-type drain region 5 is shared by the couple of elements. By the way, the source regions 12a, 12b, 12c and 12d are not formed on the p-type drain region (5) side.

It is possible, with this arrangement, to greatly minimize the area of the element and hence to increase the electric current available per unit area of the element, thus making it possible to obtain an excellent ON-state characteristic.

(A sixth example)

Figure 15:
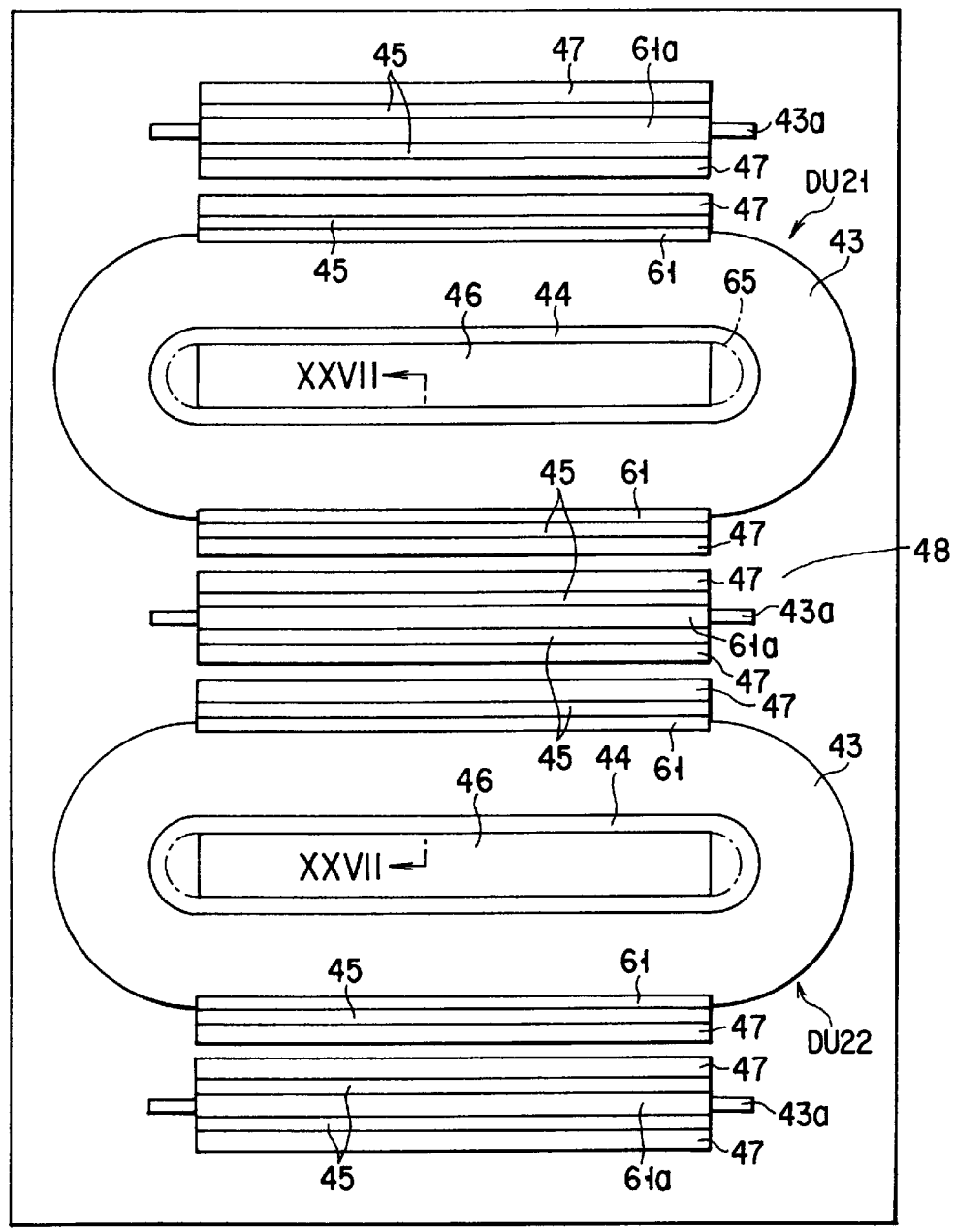
FIG. 15 is a plan view of a lateral IGBT according to a sixth example of this invention.
Figure 16:
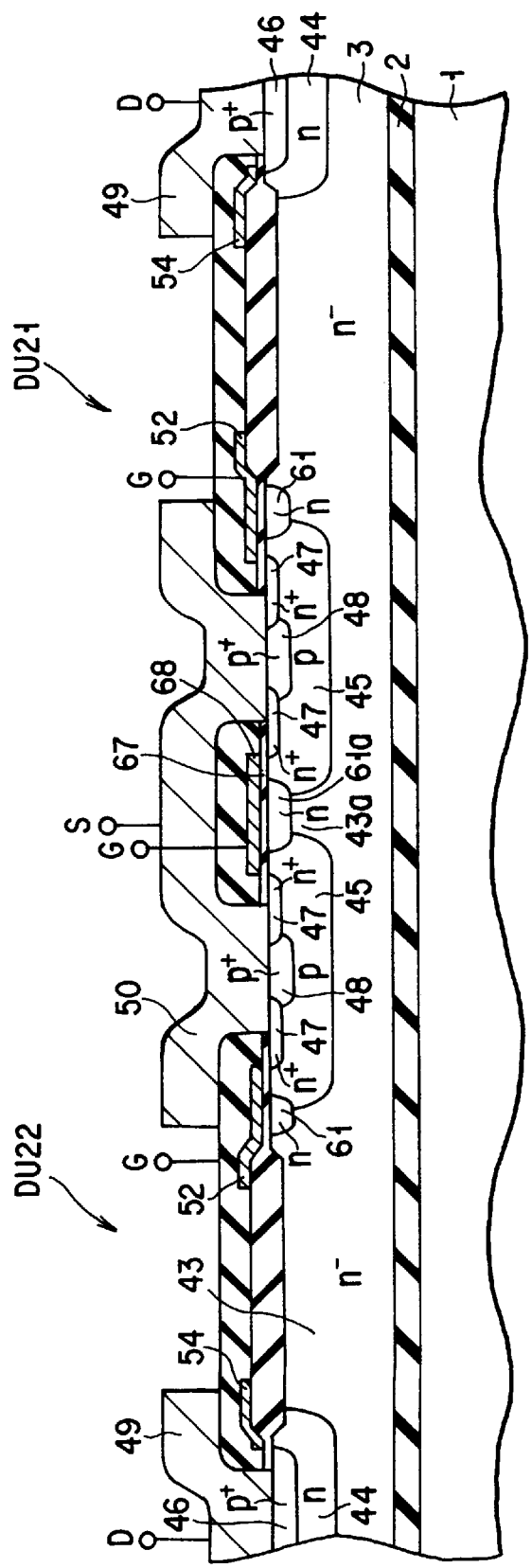
FIG. 16 is a cross-sectional view taken along the line XXVII—XXVII of FIG. 15.

FIG. 15 is a plan view schematically showing a lateral IGBT according to a sixth example of this invention, and FIG. 16 is a cross-sectional view schematically showing the lateral IGBT along line XVI—XVI in FIG. 15.

In this example, two device units DU21 and DU22 are arranged side by side. Each of the device units DU21 and DU22 has an arrangement such that a p-type base region 45 and a p⁺-type contact region 48 concentrically, completely surround a p⁺-type drain region 46. However, the device units DU21 and DU22 commonly own two MOSFET utilizing an intervening portion 43a, which is part of an n⁻-type drift region 43, and a sub-gate electrode 68. In other words, each of the device units DU21 and DU22 essentially has three n-type MOSFETs. In this case, the third n-type MOSFET of the device unit DU21, which is most distant from the drain region 46 of the device unit DU21, works as the second n-type MOSFET of the adjacent device unit DU22.

Further, in addition to an n-type relay region 61 under a main gate electrode 52, an n-type relay region 61a is formed in the surface of the intervening portion 43a to face the n⁺-type source region 47 through the p-type base region 45 under the sub-gate electrode 68. The n-type relay region 61a extends from the intervening portion 43a into the p-type base layer 45, so that it has a facing portion formed in the surface of the p-type base layer 45 to face the n⁺-type source region 47.

With this arrangement, the channel length is shortened so that an effect of decreasing the ON resistance is obtained, in all the MOSFETs formed under the main gate electrodes 52 and sub-gate electrodes 68.

Note that the left and right ends of the drain region 46 may be formed semi-circular along an n-type buffer layer 44, as indicated with one-dot chain lines 65 in FIG. 15, where current concentration at the ends of the device units is not critical.

As in this embodiment shown in FIG. 15, an n-type relay region 61a may be formed in the surface of the intervening portion 43a.

(A seventh example)

FIGS. 17A to 17H are cross-sectional views schematically showing steps of a method of fabricating the IGBT according to a seventh example, along with MOSFETs having a low breakdown-voltage in a peripheral circuit. This method can be applied to the IGBTs according to the example shown in FIGS. 15 and 16, essentially as it is, by modifying that part of the method which corresponds to the structurally modified part.

Figure 17A:
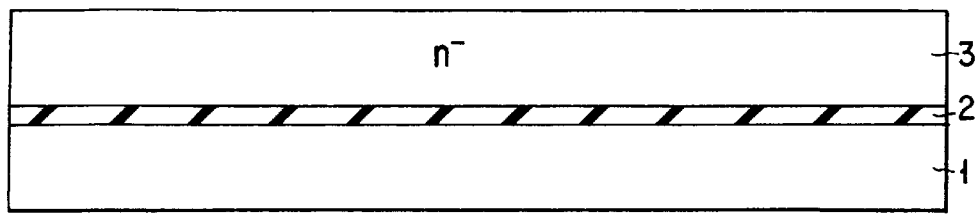
FIGS. 17A to 17H are cross-sectional views showing steps of a method of fabricating the IGBT according to a sixth example of this invention.

At first, the SOI substrate having the silicon substrate 1, silicon oxide film 2, and n-type silicon layer 3 is formed by means of a direct bonding method. The thickness of the n⁻-type silicon layer 3 is set at, e.g., about 10 μm (FIG. 17A). Note that the surface of the n⁻-type silicon layer 3 is provided with a thin silicon oxide film (not shown) having a thickness of from about several nanometers to several tens nanometers, during the following steps shown in FIGS. 17B to 17E.

Figure 17B:
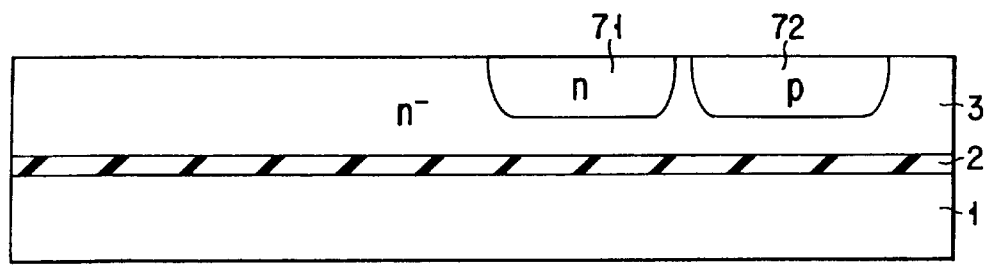

Then, a n-type well layer 71 and a p-type well layer 72 are formed in the surface of the n⁻-type silicon layer 3, for fabricating a PMOSFET and an NMOSFET, respectively, both of a low breakdown voltage. The formation steps for the n-type well layer 71 and the p-type well layer 72 are independently performed, each using processes, such as formation of a resist mask pattern by means of photo-lithography, and ion-implantation and thermal diffusion of an impurity (FIG. 17B).

Then, the n-type buffer region 44 is formed in the surface of the n⁻-type silicon layer 3. The formation step of the n-type buffer region 44 performed, using processes, such as formation of a resist mask pattern by means of photo-lithography, and ion-implantation and thermal diffusion of an impurity.

Figure 17C:
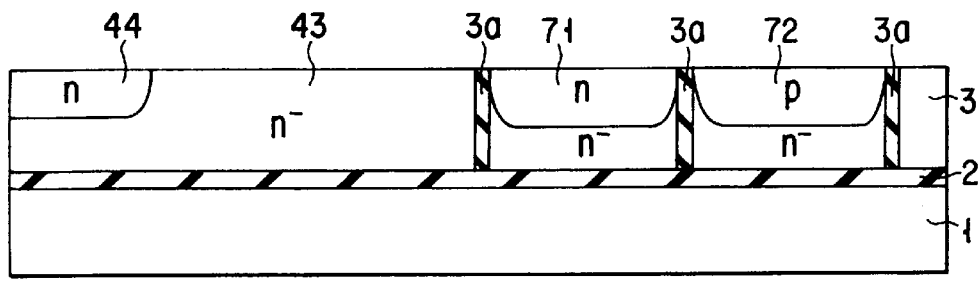

Then, trenches are formed in the n⁻-type silicon layer 3 to correspond to device isolation regions and to reach the silicon oxide film 2, and the embedded insulating films 3a of SiO₂ (or polysilicon) are formed in the trenches by means of LPCVD. With this step, a power device (IGBT) region, i.e., the n⁻-type drift region 43, is isolated from a low-breakdown-voltagedevice region, while the n-type well layer 71 and the p-type well layer 72 are isolated from each other in the low-breakdown-voltage-device region (FIG. 17C).

Figure 17D:
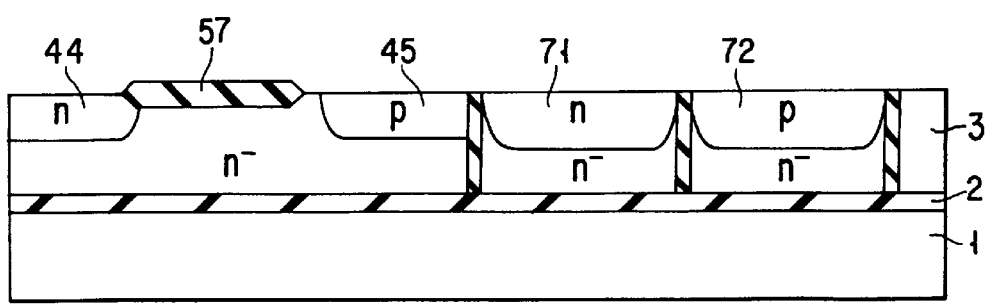

Then, the p-type base region 45 is formed in the surface of the n⁻-type drift region 43. The formation step of the p-type base region 45 is performed, using processes, such as formation of a resist mask pattern by means of photo-lithography, and ion-implantation and thermal diffusion of an impurity. Then, the thick silicon oxide film 57 having a thickness of about 1 μm is selectively formed in the IGBT region by means of an LOCOS process (FIG. 17D). Note that a thermal treatment for the LOCOS process may be used for the thermal diffusion of the impurity in the p-type base region 45.

Specifically, in the LOCOS process, the entire exposed surface of the n⁻-type drift region 3 is oxidized to form a thin oxide film having a thickness of about 0.1 μm. Further, a silicon nitride film is formed on the thin oxide film. Then, the nitride film is selectively removed to correspond to the thick oxide film 57 to be formed. Then, the overall surface is subjected to oxidation, so that the thick oxide film 57 having a thickness of about 1 μm is formed at regions where the nitride film has been removed.

Then, the remaining nitride film is removed, and an n-type diffusion region 73 and a p-type diffusion region 74 are formed in the n-type well layer 71 and the p-type well layer 72, respectively, for setting the threshold voltages of the low breakdown-voltage MOSFETs, i.e., for providing channel regions. The formation steps for the n-type diffusion region 73 and the p-type diffusion region 74 are independently performed, each using processes, such as formation of a resist mask pattern by means of photo-lithography, and ion-implantation and thermal diffusion of an impurity.

Figure 18:
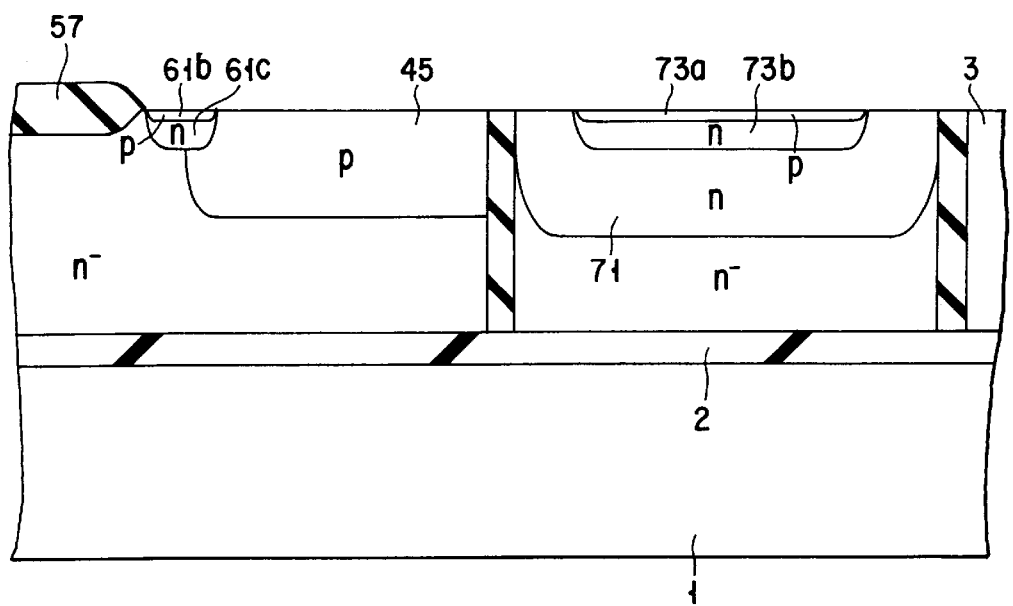
FIG. 18 is an enlarged view of FIG. 17E.

In order to reduce the threshold value (absolute value) of p-channel FET, an n-type diffusion region 73 is formed by a combination of an ion implantation of an n-type impurity (for example, phosphorous) at a high accelerating voltage and an ion implantation of a p-type impurity (for example, boron) at a low accelerating voltage using a resist pattern as a mask. For that reason, the surface region of the n-type diffusion region 73 becomes a very shallow p-type region 73a, as shown in FIG. 18. The p-type region 73a is almost depleted in an equilibrium condition.

Figure 17E:
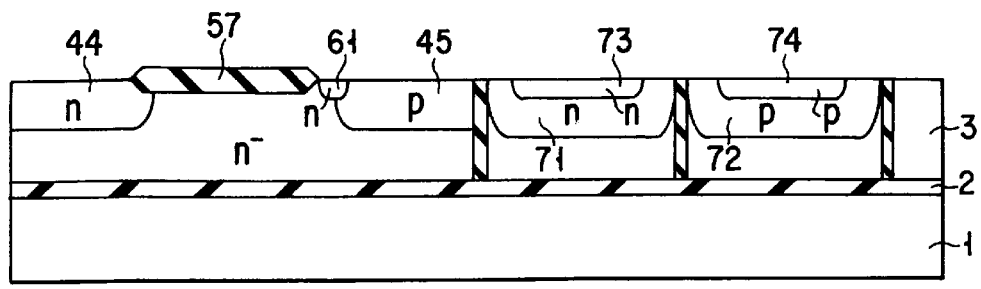

At the same time as the n-type diffusion region 73 is formed in the PMOSFET region, the n-type relay region 61 is formed in the surface of the IGBT region to extend from the n⁻-type drift layer 43 to the p-type base region 45. In other words, the formation step of the n-type relay region 61 is performed, using processes, such as formation of a resist mask pattern by means of photo-lithography, and ion-implantation (a combination of an ion implantation of an n-type impurity (for example, phosphorous) at an accelerating voltage of, e.g., 140 kV and an ion implantation of a p-type impurity (for example, boron) at an accelerating voltage of, e.g., 35 kV.) and thermal diffusion of an impurity, for forming the n-type diffusion region 73 (FIG. 17E). As a result, also the surface region of the n-type relay region 61 becomes a very shallow p-type region 61b, like the p-type diffusion region 73a, as shown in FIG. 18. The p-type region 61b is almost depleted in a thermal equilibrium condition. Where the n-type relay region 61a is also arranged under the sub-gate electrode 62 as the sixth example, the formation step of the n-type relay region 61a is performed simultaneously with the formation step of the n-type relay region 61.

Then, the thin oxide film is removed, and the gate oxide films 51 and 53 are formed in the IGBT region, while gate oxide films 75 and 76 are formed in the low-breakdown-voltage-MOSFET region.

Figure 17F:
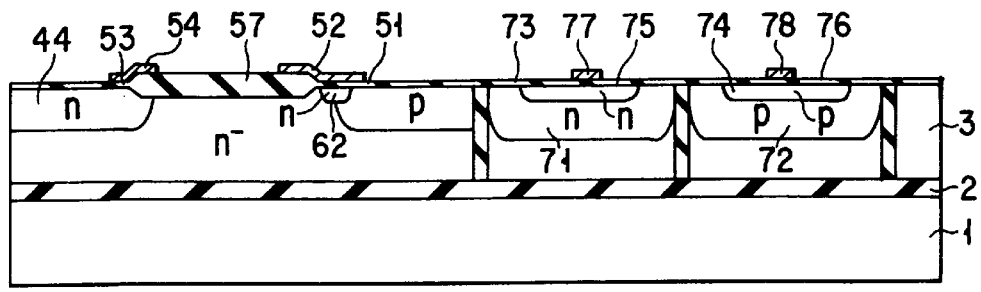

Then, a polysilicon film is formed all over and patterned to form the main gate electrode 52 and the field plate 54 in the IGBT region, and gate electrodes 77 and 78 in the low-breakdown-voltage-MOSFET region (FIG. 17F).

Figure 17G:
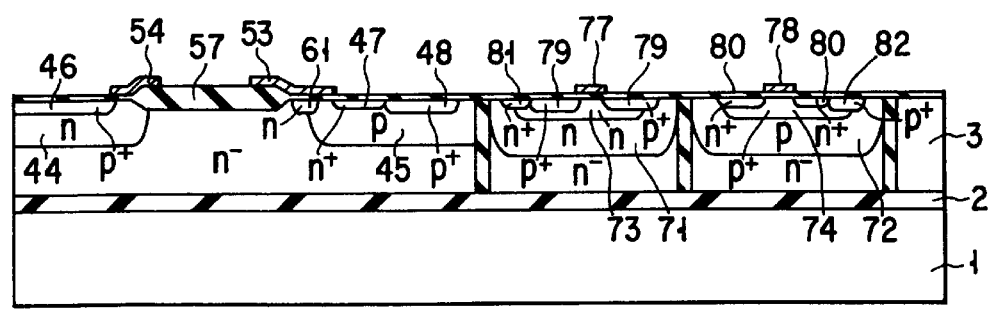

Then, the p⁺-type drain region 46 and the p⁺-type contact region 48 in the IGBT region, p⁺-type source/drain regions 79 in the PMOSFET region, and a p⁺-type diffusion region 82 in the NMOSFET region are simultaneously formed. Similarly, the n⁺-type source region 47 in the IGBT region, an n⁺-type diffusion region 81 in the PMOSFET region, and n⁺-type source/drain regions 80 in the NMOSFET region are simultaneously formed. The formation steps for the p⁺-type regions and the n⁺-type regions are independently performed, each using processes, such as formation of a resist mask pattern by means of photo-lithography, and ion-implantation and thermal diffusion of an impurity. The thermal treatments for the p⁺-type regions and the n⁺-type regions may be simultaneously performed. In these formation steps, the formed electrodes 52, 54, 77, and 78, and the oxide film 57 are also used as masks (FIG. 17G).

Figure 17H:
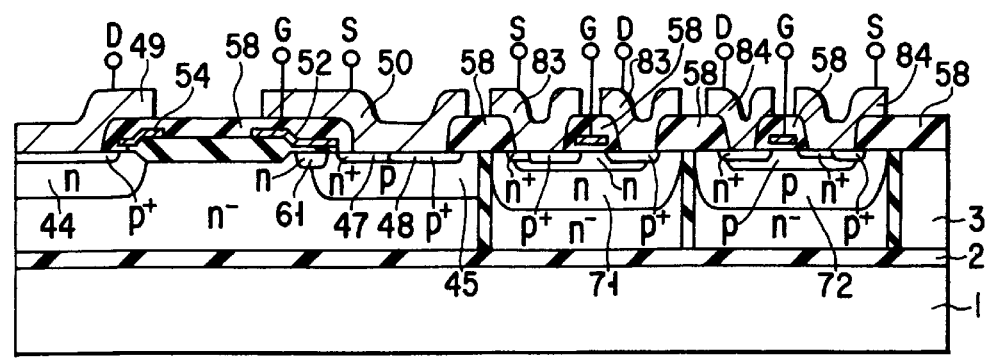

Then, the oxide film 58 is formed all over and patterned along with other insulating films, so that the contact holes are formed. Finally, the drain and source electrodes 49 and 50 in the IGBT region, source/drain electrodes 83 in the PMOSFET region, and source/drain electrodes 84 in the NMOSFET region are formed (FIG. 17H).

The order of the steps of the above described method can be changed, if necessary. For example, in order to form the p-type base region 45 deeper, ion-implantation for the p-type base region 45 is performed preferably before the trenches of the device-isolation regions are formed. The ion-implantation for the p-type base region 45 may be performed after the main gate electrode 52 is formed, so that the p-type base region 45 is formed by means of self-alignment. The trenches of the device-isolation regions may be formed first. The LOCOS process may be performed first, so that stress to be caused at the top and bottom portions of the trenches is decreased.

This invention has been explained with reference to various examples as set forth above. However, this invention should not be construed as being limited to the aforementioned examples. For example, although the aforementioned first, second, fourth, fifth and sixth examples are directed to the lateral IGBTs, they are applicable to a power MOSFET where the conductivity of the drain region is reversed.

Further, although a fine vertical IGBT has been explained in the third example, the construction of element according to the third example where the width of the bottom surface and depth of LOCOS groove are specified is not peculiar to this fine vertical IGBT, but may be applicable to other kinds of fine element having the aforementioned element structure. Namely, by applying the similar limitations to other kinds of fine element having the aforementioned element structure, almost the same effects as obtained in the aforementioned third example can be obtained. One example of such other kinds of fine element having the aforementioned element structure may be a vertical power MOSFET. It is also possible to apply the aforementioned dimensional limitations to a lateral power element such as a lateral IGBT.

As explained above, it is possible, by substituting an LOCOS gate for the conventional trench gate according to this invention, to provide a high breakdown voltage semiconductor device which is capable of preventing the lowering of mobility of carrier that may be resulted from a damage on the inner surface of groove, and hence to provide a high breakdown voltage semiconductor device which is lower in ON-state resistance as compared with the conventional high breakdown voltage semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lateral IGBT comprising:
   a semiconductor substrate;
   an insulating film formed on said semiconductor substrate;
   a first base region of a first conductivity type formed on said insulating film;
   a second base region of a second conductivity type, which is formed in a surface region of said first base region;
   a first gate insulating film formed on an inner wall of a first LOCOS groove formed passing through said second base region to reach said first base region;
   a first gate electrode formed on said first gate insulating film;
   first source region of a first conductivity type, which is formed in a surface region of said second base region around said first LOCOS groove in such a manner as to contact with said first gate insulating film;
   a first drain region of a second conductivity type, which is formed in a surface region of said first base region in such a manner as to be spaced apart from said second base region;
   a source electrode formed on said first source region and on said second base region; and
   a drain electrode formed on said first drain region.

2. The lateral IGBT according to claim 1, wherein said insulating layer has a thickness of 1 to 5 $\mu$m.

3. The lateral IGBT according to claim 1, wherein said first base region has an impurity concentration ranging from $1.0 \times 10^{10}$ cm$^{-3}$ to $3.0 \times 10^{12}$ cm$^{-3}$.

4. The lateral IGBT according to claim 1, wherein said first base region has a thickness of 20 $\mu$m or less.

5. The lateral IGBT according to claim 1, wherein said second base region is provided in a surface region thereof with a contact region of a second conductivity type having a higher impurity concentration than that of said second base region, said second base region being connected via said contact region with said source electrode.

6. The lateral IGBT according to claim 1, which further comprises a buffer region of a first conductive type which is formed in a surface region of said first base region, said drain region being formed in a surface region of said buffer region.

7. The lateral IGBT according to claim 1, which further comprises;
   a second gate insulating film formed on an inner surface of a second LOCOS groove which is formed passing through a portion between said first LOCOS groove and said first drain region to reach said first base region;
   a second gate electrode formed on said second gate insulating film; and
   a second source region of a first conductive type which is formed in a surface region of said second base region located between said second LOCOS groove and said first LOCOS groove in such a manner that said second source region contacts with said second gate insulating film.

8. The lateral IGBT according to claim 7, which further comprises;
   a second drain region formed in a surface region of said first base region which is in opposite to where said first drain region is formed and in such a manner as to be spaced apart from said second base region;
   a third gate insulating film formed on an inner surface of a third LOCOS groove which is formed passing through a portion between said first LOCOS groove and said second drain region to reach said first base region;
   a third gate electrode formed on said third gate insulating film; and
   a third source region of a first conductive type which is formed in a surface region of said second base region located between said third LOCOS groove and said first LOCOS groove in such a manner that said third source region contacts with said third gate insulating film.

9. The lateral IGBT according to claim 1, which further comprises;
   a fourth gate insulating film formed on a portion of said second base region which is located between said first LOCOS groove and said drain region;
   a fourth gate electrode formed on said second gate insulating film; and
   a fourth source region of a first conductive type which is formed in a surface region of said second base region which is located facing said first LOCOS groove and neighboring a region located directly below said second gate electrode.

10. A high breakdown voltage semiconductor device comprising:
    a first base region of a first conductivity type;
    a drain region formed in a surface region of said first base region;
    a second base region of a second conductivity type, which is formed in a surface region of said first base region;
    a gate insulation film formed on an inner wall of a LOCOS groove formed passing through said second base region to reach said first base region;

a gate electrode formed on said gate insulation film;

a source region of a first conductivity type, which is formed in a surface region of said second base region around said first LOCOS groove in such a manner as to contact with said gate insulating film;

a drain electrode formed on said drain region; and a source electrode formed on said source region and on said second conductive type base region in such a manner that a distance from the center of said source electrode to an edge of said gate electrode is not more than 0.9 $\mu$m;

wherein a width of bottom surface of said LOCOS groove is 2 $\mu$m or more and a depth of said LOCOS groove is 0.7 $\mu$m or more.

* * * * *